United States Patent
Hill

(10) Patent No.: US 7,402,533 B2
(45) Date of Patent: *Jul. 22, 2008

(54) MASKING WITHOUT PHOTOLITHOGRAPHY DURING THE FORMATION OF A SEMICONDUCTOR DEVICE

(75) Inventor: Christopher W Hill, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/514,534

(22) Filed: Aug. 31, 2006

(65) Prior Publication Data

US 2006/0292893 A1   Dec. 28, 2006

Related U.S. Application Data

(63) Continuation of application No. 10/918,695, filed on Aug. 13, 2004, now Pat. No. 7,101,814, which is a continuation of application No. 10/407,625, filed on Apr. 3, 2003, now Pat. No. 6,777,351.

(51) Int. Cl.
*H01L 21/32* (2006.01)
*H01L 21/469* (2006.01)

(52) U.S. Cl. ......... 438/783; 438/794; 438/799
(58) Field of Classification Search ......... 257/E21.487; 438/783, 794, 799
See application file for complete search history.

(56) References Cited

U.S. PATENT DOCUMENTS

| | | | |
|---|---|---|---|
| 5,438,016 A | 8/1995 | Figura et al. | 999/67 |
| 5,472,904 A | 12/1995 | Figura et al. | 999/67 |
| 5,753,962 A | 5/1998 | Jeng | 257/510 |
| 6,506,647 B2 | 1/2003 | Kuroda et al. | 438/275 |
| 6,777,351 B1 | 8/2004 | Hill | 438/783 |
| 7,101,814 B2 | 9/2006 | Hill | 438/783 |

*Primary Examiner*—Asok K Sarkar

(57) ABSTRACT

A method for forming a semiconductor device comprises forming a dielectric layer over a semiconductor wafer substrate assembly having closely spaced regions, such as a memory transistor array, and widely spaced regions, such as a periphery. Under conditions specified, the dielectric layer forms to have a first thickness over the closely spaced regions and a second thickness over the widely spaced regions. The second thickness is much thinner than the first thickness and dielectric over the widely spaced regions may be etched away with a blanket etch which leaves the majority of the dielectric layer over the closely spaced regions.

18 Claims, 4 Drawing Sheets

MASKING WITHOUT PHOTOLITHOGRAPHY DURING THE FORMATION OF A SEMICONDUCTOR DEVICE

This is a continuation of U.S. Ser. No. 10/918,695 filed Aug. 13, 2004 and issued Sep. 5, 2006 as U.S. Pat. No. 7,101,814, which is a continuation of U.S. Ser. No. 10/407,625 filed Apr. 3, 2003 and issued Aug. 17, 2004 as U.S. Pat. No. 6,777,351.

FIELD OF THE INVENTION

This invention relates to the field of semiconductor manufacture and, more particularly, to a method for providing a self-aligned mask over the surface of a semiconductor substrate assembly.

BACKGROUND OF THE INVENTION

During the formation of a semiconductor device such as memory devices, logic devices, microprocessors, etc., several photolithography steps are typically required. Each photolithography step includes the formation of a blanket photoresist (resist) layer, exposing portions of the resist layer to light using a mask or reticle, removing the exposed resist portions (or the unexposed resist portions if negative resist is used), etching the underlying layer using the resist as a pattern, then stripping the resist. To remove the resist, a high-temperature ash step is performed, then the wafer surface is exposed one or more times to an acid, typically a mixture of hydrogen peroxide ($H_2O_2$) and sulfuric acid ($H_2SO_4$), often referred to as a "piranha" process, to remove the resist ash which includes organic resins and metallic contaminants.

Photolithography adds significantly to the cost of semiconductor device production. Each photolithography step requires significant time, as the wafers must be moved from a station which deposits the resist, typically a spin-coat process, then to a stepper which exposes the resist using a mask or reticle. After the exposed or unexposed resist is removed, the wafer is moved to an etcher to etch the underlying layer, then to a furnace which ashes the resist, and finally to a piranha bath to remove the ashed resist. Photolithography also adds expense to the wafer as it requires materials including resist and acids and their eventual disposal, and also may decrease yields from misalignment of the mask.

During processing of a semiconductor device having a transistor array and a periphery, the array may require masking while the periphery remains exposed. Such a process may be used to form a silicide layer over the periphery while leaving the array free from the silicide. For example, in devices such as embedded dynamic random access memory arrays (DRAMs), it is desirable to form a suicide layer on the silicon wafer in the periphery which is not formed in the array. This is conventionally accomplished by forming a planarized sacrificial dielectric layer such as a phosphosilicate glass (PSG) layer, typically borophosphosilicate glass (BPSG), over the entire surface of the wafer, forming a patterned mask over the dielectric layer which exposes the periphery and covers other regions such as the array, etching the dielectric layer to expose the silicon wafer in the periphery and leaves dielectric over the array, forming a silicide region over the exposed silicon substrate, then removing the dielectric layer and any remaining resist.

As stated above, this process requires the formation of a dielectric layer and a resist layer, etching the dielectric layer to expose the silicon substrate, forming silicide, then removing the resist and dielectric layers. This process may cause scrap or rework by misalignment of the mask, results in additional materials and their disposal, and may possibly damage the silicon substrate during an undesirable over etch of the dielectric layer which may result in additional scrap or poorly performing devices.

A method which decreases the number of photolithography steps during the manufacture of a semiconductor device would be desirable.

SUMMARY OF THE INVENTION

The present invention provides a new method which, among other advantages, reduces the number of photolithography steps required during the manufacture of certain designs of semiconductor devices. In accordance with one embodiment of the invention a layer is deposited under certain conditions set forth in the Detailed Description of the Preferred Embodiment. Under these conditions the doped oxide film will deposit thickly over areas having densely packed topography, and will deposit more thinly over regions having widely spaced topography. The thin deposited oxide layer over the widely spaced topography may be removed using a blanket etch which leaves at least a portion of the thicker oxide layer over the densely packed topography. Thus this use of the invention allows for a patterned layer over the densely packed areas without using a photolithographic masking process. As the layer is self-aligned to the densely packed regions, there is no chance of misalignment.

Additional advantages will become apparent to those skilled in the art from the following detailed description read in conjunction with the appended claims and the drawings attached hereto.

It should be emphasized that the drawings herein may not be to exact scale and are schematic representations. The drawings are not intended to portray the specific parameters, materials, particular uses, or the structural details of the invention, which can be determined by one of skill in the art by examination of the information herein.

DETAILED DESCRIPTION OF THE PREFERRED EMBODIMENT

Figure 1:
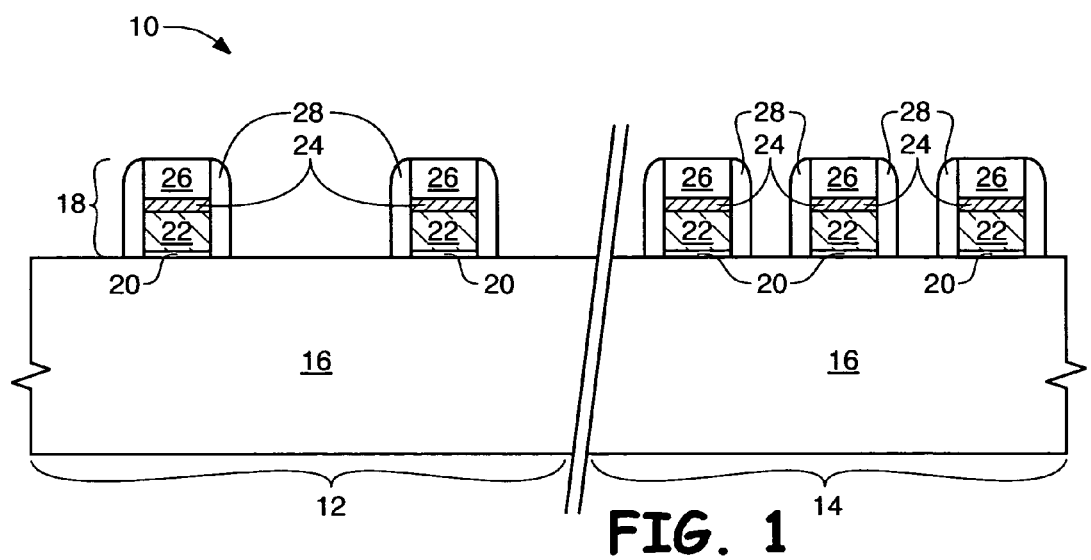
FIG. 1 is a cross section depicting a starting structure for one exemplary use of the invention.

FIG. 1 is a cross section of a semiconductor wafer substrate assembly 10 comprising the following: a region 12 of widely spaced topography; a region 14 of densely packed topography; a semiconductor wafer 16; a plurality of transistors 18 with each transistor comprising gate oxide 20, a polysilicon control gate 22, a tungsten silicide layer 24, a dielectric capping layer 26, and dielectric spacers 28. This structure may be manufactured by one of ordinary skill in the art of semiconductor device manufacture from the description herein.

For purposes of this disclosure, densely packed regions 14 comprise vertically oriented features which are spaced no less than twice the density of the widely spaced topography 12, more preferably about three times as densely as region 12, and most preferably at least four times or more as dense as region 12. That is, region 14 has at least about twice the number of vertically oriented features of a given size per unit area as region 12, more preferably about three times the number of features, and most preferably at least four times the number of vertically oriented features per unit area. Further, the mean distance between features in the widely spaced region 12 is at least two times the mean distance between features in the densely packed regions 14, more preferably at least about three times, and most preferably at least four times the mean distance between features in the densely packed regions. Additionally, the transistors 18 depicted are just one of the possible features with which the invention may be used, and other features are also possible.

It has been found that a phosphorous-doped silicon dioxide layer (phosphosilicate glass, "PSG") deposits across the surface of the entire assembly at about the same rate, but as it forms the material of the layer spontaneously migrates to the densely packed region while still in a flowable state. While the mechanism for this migration is not certain, it is believed that the layer is drawn to the densely packed region through surface tension of the flowable oxide and/or capillarity (capillary action) resulting from the close spacing of the vertical features.

As an exemplary use of the invention, it is desirable to form a silicide layer on the semiconductor wafer 16 in region 12, but not in region 14 (referring to FIG. 1). This is commonly used on devices such as embedded dynamic random access memory arrays (DRAMs). With the present invention, a self-aligned etch mask is formed to a first thickness over region 12 which has widely spaced topography, and to a second thickness over region 14 which has densely packed topography. The second thickness over the region 14 is much thicker than the first thickness over region 12.

Figure 2:
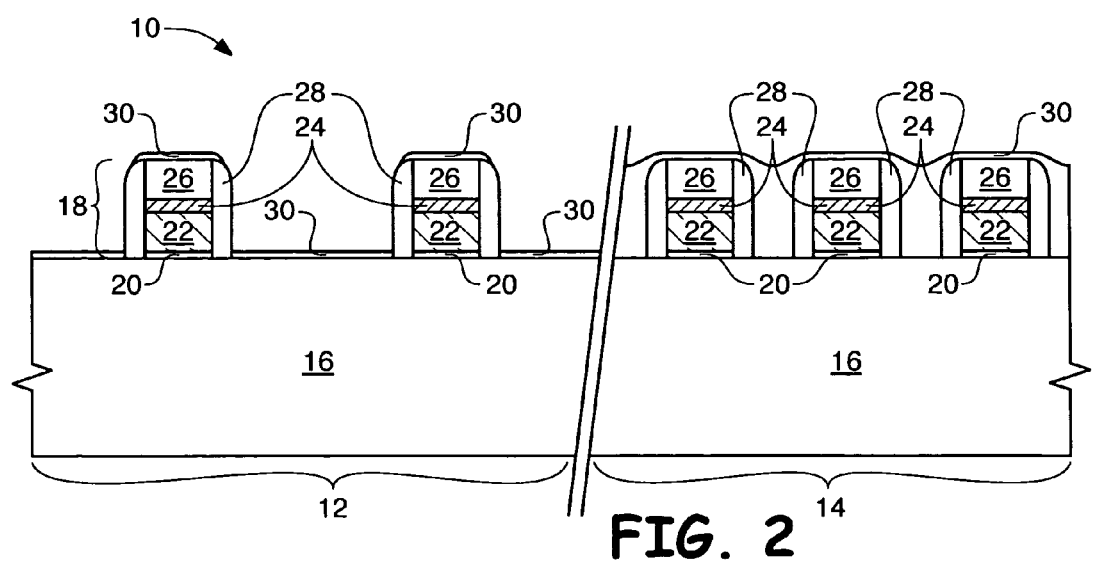
FIG. 2 is a cross section of the FIG. 1 structure after forming a self-aligned mask layer over the densely packed region, which forms much thinner over the widely spaced regions.

To form the self-aligned mask layer 30 as depicted in FIG. 2, a pulse deposition process of a PSG layer is performed. The substrate assembly is placed into a chemical vapor deposition (CVD) chamber and the temperature is increased to between about 200° C. to about 600° C., more preferably to between about 300° C. and about 500° C., and most preferably to about 350° C. The chamber pressure is not actively controlled during formation of layer 30, but is believed to be between about 2 torr and about 6 torr. Further, ozone ($O_3$) is introduced into the chamber at a flow rate of between about 5 standard liters/minute (SLM) and about 9 SLM, and more preferably at about 8 SLM. Subsequently, triethylphosphate (($C_2H_5O)_3P$) or "TEPO" is introduced at a flow rate of between about 150 milligrams per minute (mg/min) and about 250 mg/min, and most preferably at about 200 mg/min. Next, tetraethyl orthosilicate (TEOS) is introduced into the chamber at a flow rate of between about 200 mg/min and about 800 mg/min, more preferably at about 600 mg/min. As this is a sequential (pulse) deposition process, these three components are not introduced simultaneously but are instead staggered (introduced separately) according to Table 1.

TABLE 1

| Ozone | TEOS | TEPO | STEP TIME (seconds) |
| --- | --- | --- | --- |
| OFF | ON | OFF | 3 |
| OFF | OFF | OFF | 10 |
| ON | OFF | OFF | 10 |
| OFF | OFF | OFF | 10 |
| OFF | OFF | ON | 3 |
| OFF | OFF | OFF | 10 |
| ON | OFF | OFF | 10 |
| OFF | OFF | OFF | 10 |

The step time indicates the amount of time the specified gas is flowed into the chamber or, for steps when all gasses are off, the time between stopping one flow and starting the next. The times shown in Table 1 are optimal for one embodiment and may range from between about 1 second to about 5 seconds for TEOS and TEPO, from between about 1 second and about 20 seconds for ozone, and from about zero seconds (i.e. no delay when changing from one gas to another) to about 30 seconds for the steps when all gasses are off. Thus during the portion of the process described by the first three rows of Table 1, TEOS is flowed for three seconds then stopped, no gas is flowed for ten seconds, then ozone is flowed for ten seconds.

The process described according to Table 1 is repeated until a layer of sufficient thickness is formed between the features in the densely packed regions as depicted in FIG. 2. At this point, the gaps in the widely spaced regions contain only slight amounts of PSG. Depending on the height of the vertically oriented features, the material between the features in the densely packed regions is at least five times thicker than the material between the features in the widely spaced regions, and may be as much as 10 times thicker, or more than 15 times thicker. Maximizing the difference in thickness of the mask layer in the widely spaced regions relative to the densely packed regions is preferred in most embodiments of the invention as this allows a process to be performed on structures in the widely spaced regions, including to the wafer itself, while minimizing the effect of processing to the structures in the densely packed regions. During testing, the thickness of the material in the widely spaced regions was not thick enough to be accurately measured while the thickness in the densely packed regions approached the height of the features within the region. Typical dimensions and spacing in the array (densely packed regions) include a transistor width (including dielectric spacers) of about 220 nanometers (nm), a transistor height (including capping layer) of about 220 nm, and a spacing between transistors of about 40 nm. Transistors in the periphery are about the same width and height as the array transistors, with a typical transistor spacing of greater than about 400 nm to greater than about 800 nm.

After the narrow gaps are filled, additional deposited PSG will begin to accumulate in the wider gaps, possibly resulting from the lack of exertion of capillary action from features in the densely packed regions as the gaps in the densely packed regions are filled with the material. FIG. 2 illustrates transistors 16 (including capping layer 26) about 220 Å tall, a mask layer 30 about 15 Å thick over the tops of the transistors in the densely packed region, and about 200 Å thick between the transistors. Little or no PSG will accumulate in the widely spaced regions until the gaps between features in the densely packed regions are filled.

Figure 3:
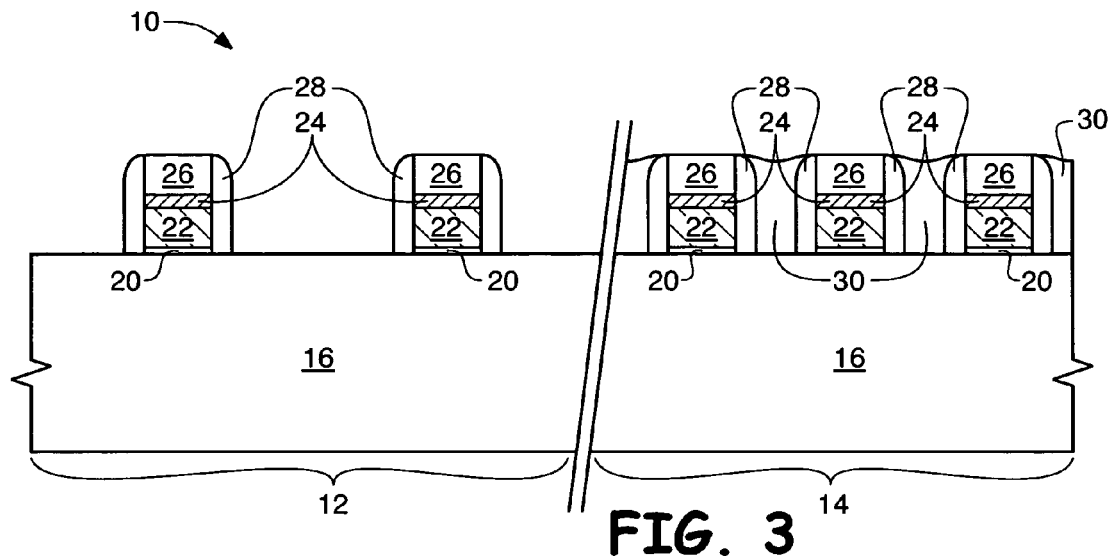
FIG. 3 is a cross section of the FIG. 2 structure after a blanket etch of the mask layer which removes the layer from the widely spaced regions and leaves the layer over the densely packed regions.

After forming the mask layer 30 as depicted in FIG. 2, a wet etch is performed to remove the mask layer 30 from the widely spaced regions 12. This also etches a portion of layer 30 from the densely packed region, but as layer 30 is thicker over region 14 a majority remains as depicted in FIG. 3. If mask layer 30 is five times (or ten times, or fifteen times) thicker in the densely packed regions as described above, removal of layer 30 from the widely spaced regions may remove up to 20% (or 10%, or 7%, respectively) of the thickness of the mask layer in the densely packed regions. In any case, a mask layer thickness sufficient to prevent processing in the densely packed region and to allow processing in the widely spaced regions will remain. A wet etch which would remove the PSG layer selective to the silicon substrate 16, spacers 28, and capping layer 26 includes an aqueous solution of hydrofluoric acid having a water:HF concentration of approximately 500:1.

Figure 4:
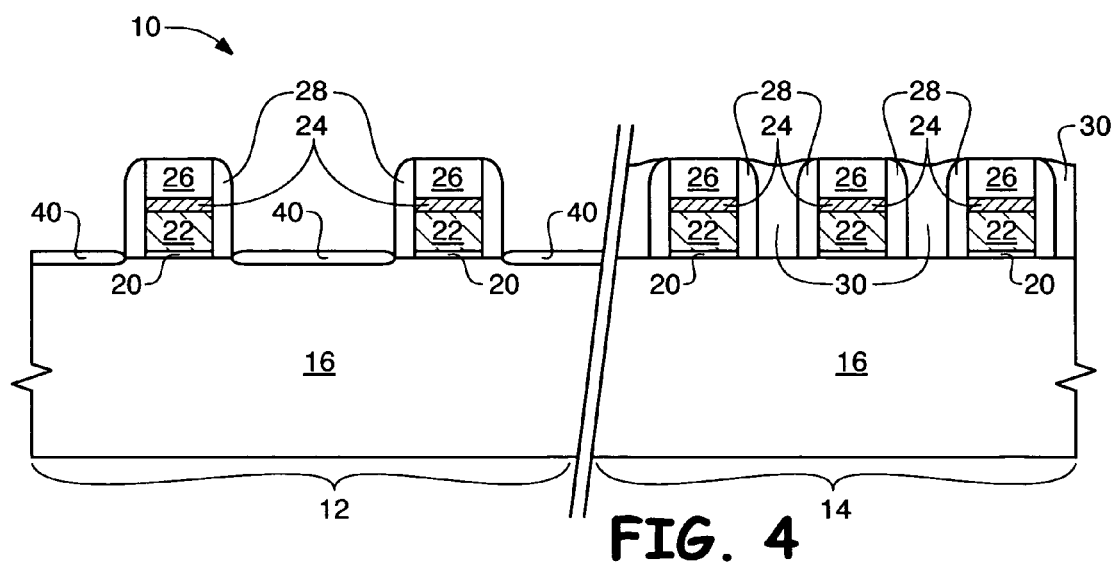
FIG. 4 depicts the FIG. 3 structure subsequent to forming a silicide layer over the widely spaced regions.

Subsequent to forming the FIG. 3 structure, a silicide process is performed to result in the FIG. 4 structure comprising silicide layer 40 over the silicon wafer 16. During the silicidation process, a portion of the wafer 16 is consumed and converted to silicide, such as tungsten silicide ($WSi_x$), titanium silicide ($TiSi_2$), nickel silicide ($NiSi_2$), or other transition metal suicides. A process which results in conversion of monocrystalline silicon to silicide includes a deposition of the transition metal, reaction of the metal with silicon in the areas where the two materials are in direct contact, followed by a wet chemical strip in a mixture of ammonium hydroxide ($NH_4OH$) and hydrogen peroxide ($H_2O_2$) to remove the unreacted metal. Mask layer 30 prevents the formation of the silicide 40 over the densely packed regions 14 while allowing its formation over the widely spaced regions 12.

Figure 5:
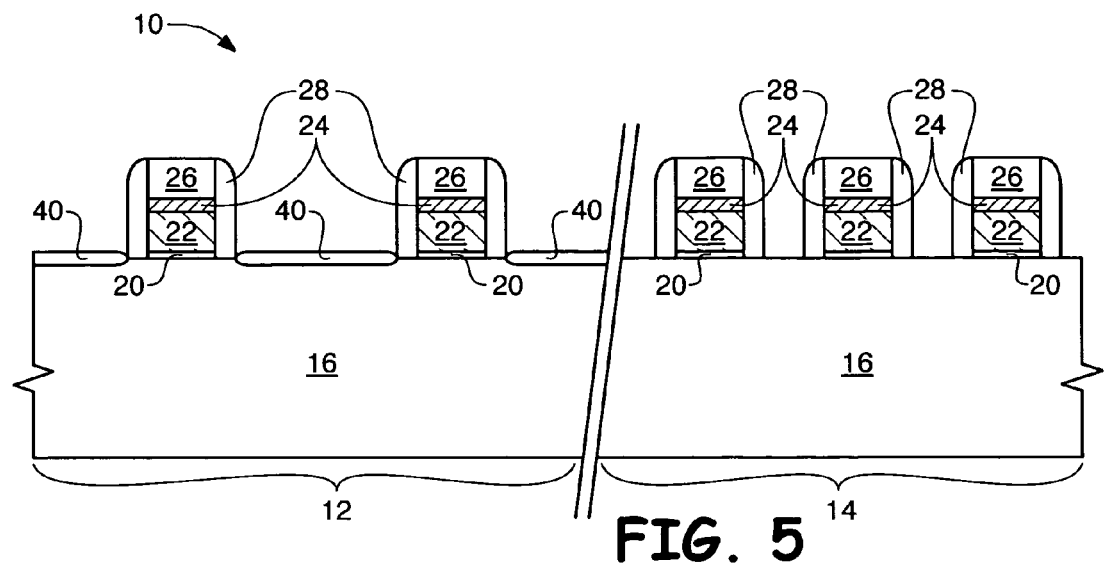
FIG. 5 is a cross section depicting the FIG. 4 structure subsequent to etching the mask layer from the densely packed regions.

Subsequent to forming silicide layer 40, the mask layer 30 is removed. This may be performed using an aqueous HF solution, and results in the structure of FIG. 5. After forming the FIG. 5 structure, wafer processing continues according to means known in the art to form a completed semiconductor device.

Figure 6:
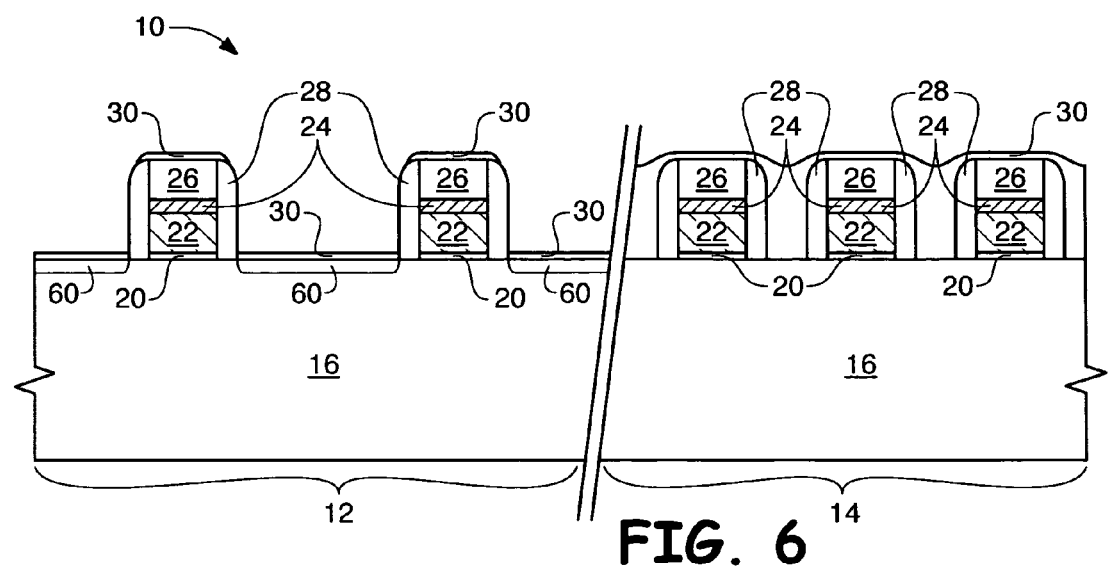
FIG. 6 is a cross section depicting another embodiment of the invention which allows an ion implant into the wafer in the widely spaced region while the densely packed region remains free from the implant.

Another exemplary use of the invention provides a mask layer which allows implanting of dopants into the wafer in the widely spaced regions without doping in the densely packed regions. In this embodiment, the structure of FIG. 2 is formed as indicated above. Mask layer 30 forms thin enough over region 12 to allow doping through layer 30 into wafer 16 without doping of the wafer of region 14 and results in the structure of FIG. 6 having implanted regions 60. Alternately, layer 30 of FIG. 2 may be etched to result in the FIG. 3 structure, then the implant can be performed to result a structure similar to that of FIG. 6 without layer 30 over region 12, but with layer 30 over region 14 as depicted.

Figure 7:
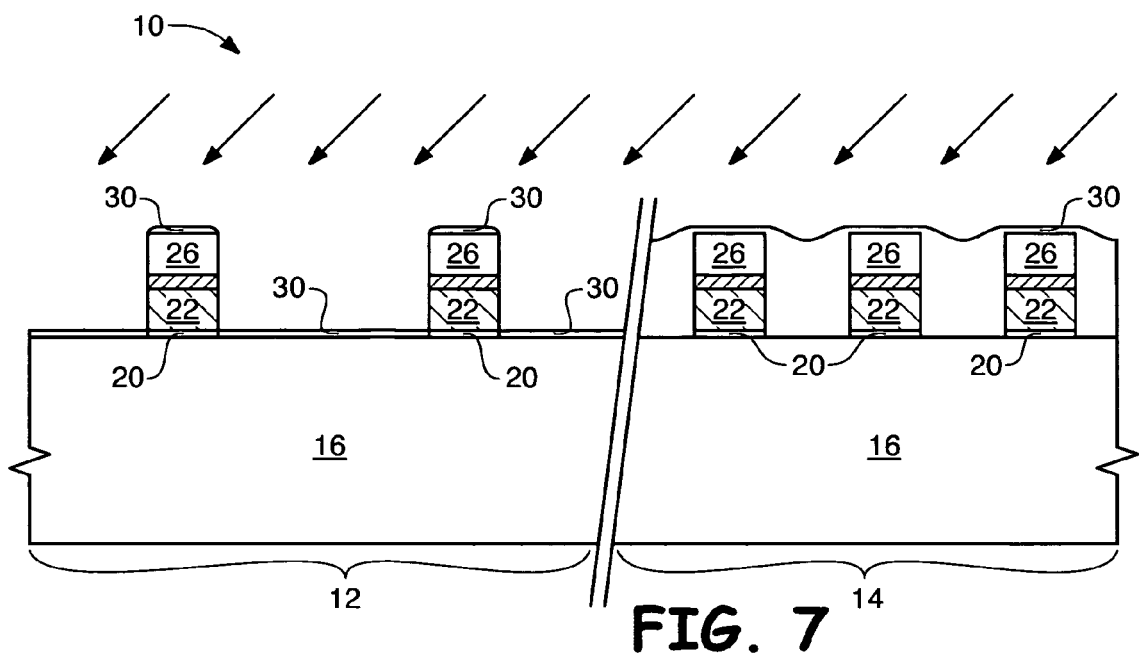
FIG. 7 is a cross section depicting an angled implant into the transistor gates in the widely spaced region while the transistors in the densely packed region remains free from the implant.

FIG. 7 depicts another possible use of the invention for angled implants into transistor gates to alter the electrical conductivity of the gates. FIG. 7 depicts a structure formed in accordance with the structure of FIG. 2, except that layer 30 is formed before providing dielectric spacers 28. In this embodiment the wafer is tipped relative to the implant direction to dope the conductive transistor gate 22 in region 12. If the self-aligned masking layer 30 remains over region 12 and the energy of the implant is adjusted accordingly, it is possible to implant transistor gates 22 in region 12 and avoid implanting the wafer 16 in regions 12 and 14. Layer 30 over region 14 also prevents doping of the transistor gates 22 in region 14.

In an embodiment similar to that depicted in FIG. 7, layer 30 may be removed prior to the implant to form a structure similar to FIG. 3, except that layer 30 is formed prior to providing dielectric spacers 28. The implant of FIG. 7 is then performed, which implants transistor gates 22 in region 12 while also implanting the wafer 16 in region 12. This implant does not affect the conductivity of transistor gates 22 or the wafer 16 in region 14 as these regions are protected by self-aligned mask layer 30.

It is evident from the description herein that the inventive process is different from a conventional process in which a conformal layer is formed to impinge on itself in narrow spaces and not impinge on itself in wider spaces. With a conventional conformal layer, the material forms with a uniform thickness over all exposed horizontal surfaces, and impinges on itself after the thickness of the layer is about half as thick as the width of the narrow space. In contrast, the inventive nonconformal layer described above forms a thick layer between the closely spaced features (or migrates to the narrow spaces) and forms a much thinner layer between the widely spaced features. Only after the material fills the gap between closely spaced features does it begin to form with any measurable thickness in the more widely spaced regions. Further, the conventional process requires at least an etch, and possibly both a mask and an etch, to result in a layer covering the densely packed regions with no layer covering the widely spaced regions, whereas the layer of the present invention forms only minimally or not at all in the widely spaced regions.

Figure 8:
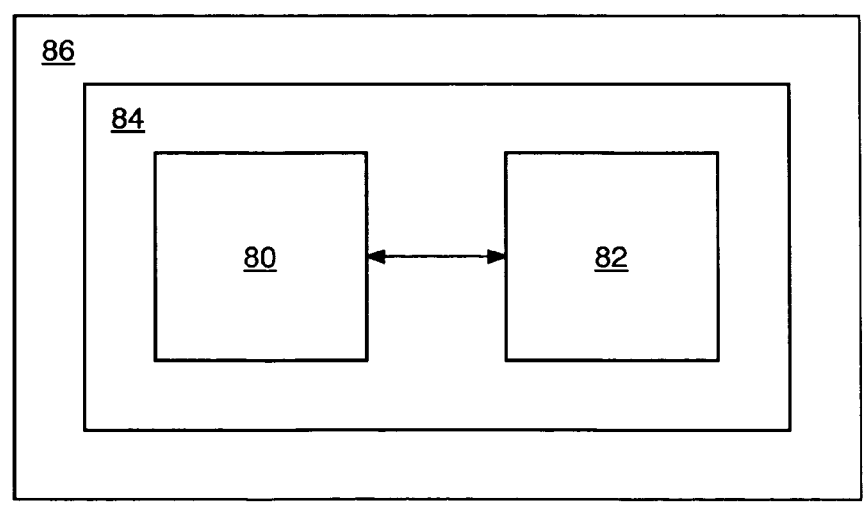
FIG. 8 depicts a use of a semiconductor device formed in accordance with the invention along with a microprocessor in an electronic device.

As depicted in FIG. 8, a semiconductor device 80 formed in accordance with the invention may be attached along with other devices such as a microprocessor 82 to a printed circuit board 84, for example to a computer motherboard or as a part of a memory module used in a personal computer, a minicomputer, or a mainframe 86. FIG. 8 may also represent use of device 80 in other electronic devices comprising a housing 86, for example devices comprising a microprocessor 82, related to telecommunications, the automobile industry, semiconductor test and manufacturing equipment, consumer electronics, or virtually any piece of consumer or industrial electronic equipment.

While this invention has been described with reference to illustrative embodiments, this description is not meant to be construed in a limiting sense. Various modifications of the illustrative embodiments, as well as additional embodiments of the invention, will be apparent to persons skilled in the art upon reference to this description. For example, various other materials may be used instead of the ozone, TEPO, and TEOS described for the process. Materials which may be used in some embodiments of the invention instead of ozone include molecular oxygen ($O_2$) or steam at the deposition conditions listed for ozone, and an alternative to TEPO includes tris(tert-butoxy)silanol (TBOS, formula $HOSi(O^tBu)_3$) at the deposition conditions listed for TEPO. It is therefore contemplated that the appended claims will cover any such modifications or embodiments as fall within the true scope of the invention.

Further, in the discussion and claims herein, the term "on" used with respect to two layers, one "on" the other, means at least some contact between the layers, while "over" means the layers are in close proximity and may be contacting, but possibly with one or more additional intervening layers such that contact is possible but not required. Neither "on" nor "over" implies any directionality as used herein.

The invention claimed is:

1. A method used during fabrication of a semiconductor device, comprising:

forming a semiconductor wafer substrate assembly comprising a plurality features in a first region and a plurality of features in a second region, wherein a mean distance between adjacent features in the first region is different than a mean distance between adjacent features in the second region; and flowing a nonconformal layer over the first region and over the second region at a uniform rate, wherein, during the flowing, the nonconformal layer at least partially migrates from the second region to the first region to result in the nonconformal layer having a first thickness in the first region and a second thickness in the second region, wherein subsequent to the formation and prior to an etch of the nonconformal layer, the first thickness is greater than the second thickness.

2. The method of claim 1 further comprising forming the features in the second region to have a mean distance between adjacent features of at least twice the mean distance between adjacent features in the first region.

3. The method of claim 1 further comprising forming the features in the second region to have a mean distance between adjacent features of at least four times the mean distance between adjacent features in the first region.

4. The method of claim 1 wherein the flowing of the nonconformal layer comprises:
   placing the semiconductor wafer substrate assembly into a deposition chamber;
   flowing the nonconformal layer with a process comprising introducing ozone ($O_3$), tetraethyl orthosilicate (TEOS), and at least one of triethylphosphate (TEPO) and tris (tert-butoxy)silanol (TBOS) into the deposition chamber.

5. The method of claim 4 wherein flowing the nonconformal layer comprises:
   introducing TEOS into the chamber for a timed period without introducing $O_3$, TEPO, and TBOS; then
   introducing none of TEOS, $O_3$, TEPO, and TBOS into the chamber for a timed period; then
   introducing $O_3$ into the chamber for a timed period without introducing TEOS, TEPO, and TBOS; then
   introducing none of TEOS, $O_3$, TEPO, and TBOS into the chamber for a timed period; then
   introducing one of TEPO and TBOS into the chamber for a timed period without introducing TEOS and $O_3$; then
   introducing none of TEOS, $O_3$, TEPO, and TBOS into the chamber for a timed period; then
   introducing $O_3$ into the chamber for a timed period without introducing TEOS, TEPO, and TBOS; then
   introducing none of TEOS, $O_3$, TEPO, and TBOS into the chamber for a timed period.

6. The method of claim 5 further comprising maintaining a chamber temperature of between about 200° C. and about 600° C. during the flowing of the nonconformal layer.

7. The method of claim 6 further comprising performing an etch on the nonconformal layer in the first region and the second region.

8. The method of claim 7 wherein the etch is a wet etch.

9. The method of claim 7 further comprising, subsequent to the etch, forming a silicide layer in the second region, wherein the nonconformal layer prevents the suicide layer from forming in the first region.

10. The method of claim 5 further comprising maintaining a chamber temperature of between about 300° C. and about 500° C. during the flowing of the nonconformal layer.

11. The method of claim 5 further comprising maintaining a chamber temperature of about 350° C. during the flowing of the nonconformal layer.

12. The method of claim 4 wherein flowing the nonconformal layer comprises:
   introducing TEOS into the chamber for between about 1 second to about 5 seconds without introducing $O_3$, TEPO, and TBOS; then
   introducing $O_3$ into the chamber for between about 1 second and about 20 seconds without introducing TEOS, TEPO, and TBOS; then
   introducing one of TEPO and TBOS into the chamber for between about 1 second and about 5 seconds without introducing TEOS and $O_3$; then
   introducing $O_3$ into the chamber for between about 1 second and about 20 seconds without introducing TEOS, TEPO, and TBOS.

13. The method of claim 12 further comprising maintaining a chamber temperature of between about 200° C. and about 600° C. during the flowing of the nonconformal layer.

14. The method of claim 12 further comprising maintaining a chamber temperature of between about 300° C. and about 500° C. during the flowing of the nonconformal layer.

15. The method of claim 12 further comprising maintaining a chamber temperature of about 350° C. during the flowing of the nonconformal layer.

16. The method of claim 1 further comprising implanting the semiconductor wafer substrate assembly, such that the nonconformal layer masks the implantation such that an implant concentration of the semiconductor wafer substrate assembly is different at the first region than at the second region.

17. The method of claim 16 wherein the implanting of the semiconductor wafer substrate assembly results in a higher implant concentration of the semiconductor wafer substrate assembly at the second region than at the first region.

18. A method used during fabrication of an electronic device comprising a semiconductor device, comprising:
   providing at least one semiconductor device formed by a method comprising:
      forming a semiconductor wafer substrate assembly comprising a plurality features in a first region and a plurality of features in a second region, wherein a mean distance between adjacent features in the first region is different than a mean distance between adjacent features in the second region; and
      flowing a nonconformal layer over the first region and over the second region at a uniform rate, wherein, during the flowing, the nonconformal layer at least partially migrates from the second region to the first region to result in the nonconformal layer having a first thickness in the first region and a second thickness in the second region, wherein subsequent to the formation and prior to an etch of the nonconformal layer, the first thickness is greater than the second thickness;
   providing at least one microprocessor; and
   electrically coupling the microprocessor and the at least one semiconductor device to facilitate the passage of electrical signals therebetween.

* * * * *

UNITED STATES PATENT AND TRADEMARK OFFICE
CERTIFICATE OF CORRECTION

PATENT NO. : 7,402,533 B2 Page 1 of 1
APPLICATION NO. : 11/514534
DATED : July 22, 2008
INVENTOR(S) : Hill It is certified that error appears in the above-identified patent and that said Letters Patent is hereby corrected as shown below:

In column 7, line 60, in Claim 9, delete "suicide" and insert -- silicide --, therefor.

Signed and Sealed this

Seventh Day of October, 2008

JON W. DUDAS
*Director of the United States Patent and Trademark Office*